_United States Patent_ [19]

Gibson, Jr. et al.

[11] Patent Number: 5,085,976

[45] Date of Patent: Feb. 4, 1992

[54] PROCESS FOR DIMENSIONALLY STABILIZING PHOTOPOLYMER FLEXOGRAPHIC PRINTING PLATES

[75] Inventors: Joseph W. Gibson, Jr., Wilmington, Del.; Anthony J. Bart, Cherry Hill, N.J.; Robert J. Verbiar, West Chester, Pa.; S. Andries R. D. Sebastian, Hixson, Tenn.

[73] Assignee: E. I. Du Pont de Nemours and Company, Wilmington, Del.

[21] Appl. No.: 535,643

[22] Filed: Jun. 11, 1990

[51] Int. Cl.$^5$ .................. G03F 7/004; G03F 7/40
[52] U.S. Cl. .................. 430/306; 430/309; 430/328; 101/463.1
[58] Field of Search .............. 101/463.1, 467; 430/309, 328, 306

[56] References Cited

U.S. PATENT DOCUMENTS

| | | | |
|---|---|---|---|
| 4,326,018 | 4/1982 | Jargiello | 430/15 |
| 4,338,007 | 7/1982 | Fromson et al. | 355/100 |
| 4,400,459 | 8/1983 | Gruetzmacher et al. | 430/306 |
| 4,400,460 | 8/1983 | Fickes et al. | 430/306 |
| 4,806,506 | 2/1989 | Gibson, Jr. | 430/309 |
| 4,894,315 | 1/1990 | Feinberg et al. | 430/281 |
| 4,906,551 | 3/1990 | Herrmann | 430/309 |

FOREIGN PATENT DOCUMENTS 0017927 9/1984 European Pat. Off. .

OTHER PUBLICATIONS

_Photochemistry_, by Jack G. Calvert and James N. Pitts, Jr., Experimental Methods in Photochemistry, p. 691.
_Fusion Ultraviolet Curing Systems Model F450_, product literature issued by Fusion UV Curing Systems ™.

_Primary Examiner_—Charles L. Bowers, Jr.
_Assistant Examiner_—Janis L. Dote
_Attorney, Agent, or Firm_—Karen K. King

[57] ABSTRACT

A process for substantially improving dimensional stability in photopolymeric flexographic relief printing plates wherein the surface of the printing plate is post-exposed to a high intensity radiation source having broad wavelength emission in the 200 to 700 nm range.

4 Claims, No Drawings

PROCESS FOR DIMENSIONALLY STABILIZING PHOTOPOLYMER FLEXOGRAPHIC PRINTING PLATES

FIELD OF THE INVENTION

This invention relates to photosensitive flexographic elastomeric relief printing plates, and more particularly, to a process for substantially improving dimensional stability of such plates by exposing the plates to a high intensity radiation source.

BACKGROUND OF THE INVENTION

Processes for producing flexographic printing plates from a photopolymerizable element are well known in the art; see e.g. Plambeck, U.S. Pat. No. 2,760,863; Suzuki et al., U.S. Pat. No. 3,556,791; Varga et al., U.S. Pat. No. 3,798,035; Kurka, U.S. Pat. No. 3,825,430; Recchia et al., U.S. Pat. No. 3,951,657. Typically, these processes include (1) exposing imagewise a photopolymerizable element to actinic radiation emitting a wavelength in the range of 365 nm, (2) removing the unexposed or unpolymerized areas of the plate with solvent and (3) drying the resulting plate. The photopolymerized element can then be detackified by exposing the element to ultraviolet radiation emitting a wavelength in the range of 254 nm. To ensure final plate hardening and photopolymerization, the printing element can be further post-exposed to radiation emitting at wavelengths in the range of 365 nm. Although processes such as these are commonly used, they have the disadvantage of producing plates that are dimensionally unstable over time.

Current platemaking processes utilize various sources of radiation for developing relief images and maximizing plate hardening. For example, actinic radiation from a variety of sources can be used, including commercial ultraviolet fluorescent tubes, medium, high, and low pressure mercury vapor lamps, argon glow lamps, photographic flood lamps, pulsed xenon lamps, carbon arc lamps, etc. It has been found that photopolymeric flexographic relief printing plates prepared using conventional radiation sources shrink and lose weight over time due to photoshrinkage, evaporation of volatiles and solvent extraction. Currently, photopolymer plate shrinkdown can be of such magnitude that, at times, the printing latitude of presses is exceeded and consequently, the gears bottom out and the printing run is aborted. Thus, reducing plate shrinkage is particularly important in the flexographic printing plate industry because maximum consistent print quality will be obtained using plates with reduced shrinkage.

SUMMARY OF THE INVENTION

The invention relates to a process for substantially improving dimensional stability in a flexographic printing plate, said process comprising:
(A) imagewise exposing a photopolymerizable layer containing
 (a) a binder,
 (b) a polymerizable monomer, and
 (c) a photoinitiator system;
(B) removing the non-polymerized, unexposed areas with a washout developer;
(C) drying the plate; and
(D) post-exposing the resulting relief printing plate, wherein dimensional stability is substantially improved by post-exposing the plate with a high intensity radiation source.

DETAILED DESCRIPTION OF THE INVENTION

According to the present invention, flexographic printing plates with high dimensional stability can be produced by exposing a photopolymerizable composition to a high intensity radiation source emitting wavelengths in the range of 200 to 700 nm.

The term "high intensity radiation source" means a source having an output of at least 100 watts/linear inch and which provides an intensity of at least 30 mW/cm$^2$ at the surface of the photopolymerizable element. In practice, the source is held at a distance of 5-25 cm from the surface of the element. Light sources having an output of around 200 watt/linear inch are generally acceptable.

High intensity radiation sources suitable for practicing the present invention include medium and high pressure mercury lamps, electrode or microwave excitable lamps (for example, Fusion lamps, Western Quartz lamps, etc.). A very high intensity ultraviolet lamp is the preferred radiation source for substantially improving dimensional stability in flexographic printing plates.

It is desirable that the radiation source have broad wavelength emissions, that is, the radiation source should be capable of emitting wavelengths in the 200 to 700 nm range. A very high intensity lamp can be used in a number of ways. For example, it can be used during post-exposure only or it can be used to simultaneously detackify and post-expose. It can also be used to post-expose and imagewise expose. Alternatively, a very high intensity lamp can be used to imagewise expose, detackify and post-expose. When the radiation source is used only for post-exposure, the source should be capable of emitting wavelengths in the range of 300 nm to 700 nm. When the radiation source is used to detackify and post-expose, it should be capable of emitting wavelengths in the 200 to 300 nm range and 300 to 700 nm range. The preferred approach is to simultaneously post-expose and detackify.

By the term "substantially improving dimensional stability" it is meant that plate shrinkage is reduced by at least 15% as compared to plates exposed to conventional or low intensity radiation sources. Generally, plate shrinkage is reduced by 40-50% dependent on plate composition.

The photopolymerizable layer comprises a binder, a polymerizable monomer and a photoinitiator system. The binder is an elastomeric polymer. Suitable binders can include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers of the binders. The block copolymers discussed in U.S. Pat. Nos. 4,323,646; 4,430,417; and 4,045,231, all of which are incorporated by reference, can be used. The Kraton ® family of triblock copolymers are manufactured by the Shell Chemical Company and are also suitable for practicing this invention.

The term binder, as used herein, encompasses core shell microgels and blends of microgels, preformed macromolecular polymers and monomers. Suitable core-shell microgels are described in applicants' assignee's patent, U.S. Pat. No. 4,894,315 which issued Jan. 16, 1990, the disclosure of which is hereby incorporated by reference. The term core-shell microgel means a particle having two domains—a crosslinked core and an aqueous processible non-crosslinked shell. The core should have less than 10% crosslinking. The shell consists of an acid-modified copolymer which is not crosslinked. In addition, a grafting agent may be added to chemically bond the core to the shell.

Typically, the microgels used have elastomeric crosslinked cores and aqueous processible elastomeric non-crosslinked shells or thermoplastic non-crosslinked shells. A preferred microgel has an elastomeric crosslinked core and an elastomeric non-crosslinked shell.

Core-shell microgels can be made from a wide variety of starting materials. Conventionally, monoethylenically unsaturated monomers are used in preparing the bulk portion of the microgel, whereas the crosslinking agents and grafting agents contain at least two double bonds. Generally the amount of crosslinking agent in the microgel will be less than 20% by weight of the overall weight. The amount of grafting agent will generally be less than 1% by weight of the overall weight of the microgel. The weight ratio of the core to the shell is usually in the range from about 4:1 to about 1:4.

Microgels suitable as binders can be produced by the technique of emulsion polymerization as described in U.S. Pat. No. 3,895,082 and British Pat. No. 967,051. Well-known techniques of coagulation, filtration, washing and drying can be employed to convert the microgels to a solid prior to their use in the photosensitive composition.

Monomers suitable for the practice of the present invention are addition-polymerizable ethylenically unsaturated compounds. The photosensitive layer can contain a single monomer or a mixture of monomers which must be compatible with the binder to the extent that a clear, non-cloudy photosensitive layer is produced. Monomers that can be used in the photosensitive layer are well known in the art. Examples of such monomers can be found in U.S. Pat. Nos. 4,323,636, 4,753,865, 4,726,877 and Applicants' assignee's patent U.S. Pat. No. 4,894,315. It is preferred that the monomer be present in at least 5% by weight of the photosensitive layer.

A plasticizer can be used in the instant invention, however, it should be compatible with the binder. Examples of suitable plasticizers are liquid low molecular weight (MW<5000) polybutadienes and aliphatic hydrocarbon oils. If a plasticizer is used, it is usually present in at least 5% by weight of the photosensitive composition.

The preferred photoinitiator is a free radicalgenerating addition polymerization initiator activatable by actinic light and thermally inactive at and below 185° C. Photoinitiators of this type include the substituted or unsubstituted polynuclear quinones. Examples of these compounds are disclosed in applicants' assignee's patent U.S. Pat. No. 4,894,315. Initiators are present in amounts from 0.001% to 10.0% or more based on the weight of the photosensitive composition.

Photopolymerizable compositions suitable for use in flexographic printing plates can be organic, aqueous or semiaqueous solvent soluble. Developers, i.e. liquids used for removing unpolymerized areas, can be organic solvents, aqueous or semiaqueous solutions. Photopolymerizable layers of the type taught in Plambeck, U.S. Pat. No. 2,760,863; Chen and Brennan, U.S. Pat. No. 4,323,636; Toda et al., U.S. Pat. No. 4,045,231; Heinz et al., U.S. Pat. No. 4,320,188; are prepared from polymeric components which are soluble only in organic solvents. These polymeric components include elastomeric block copolymers such as the ones described in U.S. Pat. Nos. 4,430,417, 4,045,231; 4,323,636. Suitable developers for these compositions include aromatic or aliphatic hydrocarbon and aliphatic or aromatic halohydrocarbon solvents, for example, perchloroethylene, 1,1,1-trichloroethane, tetrachloroethane, trichloroethylene, benzene, toluene, xylene, hexane, isononylacetate, methylisobutylketone or mixtures of such solvents with suitable alcohols. Other organic solvent developers have been disclosed in published German Application No. 3828551.

Photopolymerizable layers prepared from polymeric components which are soluble in aqueous or semiaqueous solvents, are described in Alles, U.S. Pat. No. 3,458,311, Pohl, U.S. Pat. No. 4,442,302; Pine, U.S. Pat. No. 4,361,640; Kai et al., U.S. Pat. No. 3,794,494; Proskow, U.S. Pat. Nos. 4,177,074 and 4,431,723; and Worns, U.S. Pat. No. 4,517,279.

Preferred semiaqueous developers usually contain a water miscible organic solvent and an alkaline material. Suitable water miscible organic solvents include isopropanol, butanol, diacetone alcohol, 1-methoxyethanol, 2-ethoxyethanol, butyl carbitol and 2-n-butoxyethanol. Suitable alkaline materials include alkali metal hydroxides, Group I and II metal calcogens, hydroxides and carbonates. Other suitable aqueous developer combinations are described in U.S. Pat. No. 3,796,602.

The photopolymerizable compositions described above can be prepared in any suitable way by mixing the ingredients using techniques which are well known in the art. Photosensitive elements, comprising a layer of photopolymerizable material on a flexible support, can be prepared by forming the photopolymerizable composition into sheets by, for example, solvent-casting, hot pressing, calendering, or extrusion methods, and affixing them to the support. Suitable support materials include metal sheets or foils and film-forming synthetic resins or polymers, such as the addition polymers and linear condensation polymers. Preferred support materials are polyester films.

A transparent cover sheet such as a thin film of polyester, polystyrene, polyethylene, polypropylene or other strippable material can be used to prevent contamination of or damage to the photosensitive layer during storage or manipulation. For solvent developable photopolymerizable compositions, a thin hard, flexible, solvent-soluble layer, such as a layer of a polyamide, copolymer of polyethylene and polyvinyl acetate etc., can be used on the upper surface of the photosensitive layer to protect for reuse, to protect the image-bearing negative or transparency superposed thereon or to improve contact or alignment with the photosensitive surface.

Alternatively, multilayer cover elements such as those disclosed in Gruetzmacher et al. U.S. Pat. Nos. 4,427,759 and 4,460,675 can be used.

Printing reliefs can be made in accordance with this invention by first exposing selected portions of the photosensitive element to actinic radiation. Specifically, selected portions of the photosensitive element are exposed through an image-bearing transparency having areas substantially transparent to actinic radiation.

Actinic radiation from any source and of any type can be used in the image-wise exposure step. The radiation can emanate from point sources or be in the form of parallel rays or divergent beams. Inasmuch as the free-radical generating systems activatable by actinic radiation generally exhibit their maximum sensitivity in the ultraviolet range, the radiation source should furnish an effective amount of this radiation, preferably having a wavelength range between about 300 and 700 nm. Suitable sources of such radiation, in addition to sunlight, include carbon arcs, mercury-vapor arcs, fluorescent lamps with ultraviolet radiation-emitting phosphors, argon glow lamps, and photographic flood lamps. As discussed above, the image-wise exposure can also be accomplished using a high intensity radiation source such as the Fusion lamp or Western Quartz lamp.

A backflash exposure may be used with elements having a transparent support. Backflash generally uses a radiation source emitting a principal wavelength around 360 nm. It serves to sensitize the plate and establishes the depth of the plate relief. The backflash procedure gives the photopolymer layer a uniform and relatively short exposure through the support, thereby photocrosslinking binder and monomer in the support region.

The image-wise irradiation time can vary from fractions of a second to minutes, depending upon the intensity and spectral energy distribution of the radiation source, its distance from the composition and the nature and amount of the composition available.

After imagewise exposure, the image can be developed by washing with a suitable developer. Solvent development can generally be carried out at room temperature. Development time can vary, however, the preferred development time is less than 25 minutes. Developer can be applied in any convenient manner, including immersion, spraying and brush or roller application. Brushing aids in removing the unpolymerized or non-crosslinked portions of the composition. Washout is frequently carried out in an automatic processing unit which uses solvent and mechanical brushing action to remove the unexposed portions of the plate, leaving a relief image constituting the exposed image and floor.

Following solvent development, the relief printing plates are generally blotted or wiped clean, and then dried in a forced air or infrared oven. Although drying times and temperatures may vary, typically the plates are dried for 30 to 120 minutes at 60° C. (140° F.)

Detackification is an optional post-development treatment which can be applied if the surface is still tacky. Tackiness can be removed by methods well known in the art such as treatment with bromine or chlorine solutions. See, e.g., U.S. Pat. No. 4,400,460 and German Patent, DE No. 2 823 300. U.S. Pat. No. 4,400,459 to Gruetzmacher et al. which teach a process for detackifying photosensitive elastomeric flexographic printing plates, wherein the developed dried surface is, in either order, (1) post-exposed to actinic radiation, and (2) treated with a solution of an alkali monopersulfate and a bromide salt.

Exposure to radiation sources having a wavelength not longer than 300 nm has been used to remove plate tackiness. For example, European Published Patent Application No. 0 017927 to Nakamura et al. describes a process for detackifying a photosensitive elastomeric printing plate using a light source emitting light with a wavelength in the range of 200 to 300 nm. The light sources disclosed include heavy-hydrogen lamps, low-pressure mercury lamps, and germicidal lamps. Gibson, U.S. Pat. No. 4,806,506 the disclosure of which is hereby incorporated by reference, teaches an improved process for detackifying imagewise exposed and solvent-developed photopolymeric flexographic relief printing plate wherein an aprotic organic solvent is applied to the surface of the printing plate after the developed plate is dried but prior to irradiation with light having wavelengths in the 200 to 300 nm range. As discussed above, the light finishing exposure can also be accomplished using a high intensity radiation source such as the Fusion lamp or Western Quartz lamp.

The final step in producing a flexographic printing plate is a post-exposure step. Flexographic printing plates are typically post-exposed to ensure that the photocrosslinking process is complete and that the plate will remain stable during printing and storage. Post-exposure is used to complete polymerization and maximize plate hardness.

In practicing the invention, the post-exposure step is carried out using a high intensity radiation source, i.e., one having an output of at least 100 watts per linear inch. The radiation source should have substantial spectral output in the range of 300 to 700 nm and should provide an intensity of at least 30 mW/cm$^2$ at the surface of the photopolymerizable element.

The following examples serve to illustrate the practice of the present invention.

EXAMPLES

In the examples, dimensional stability was determined in an oven aging test which simulated actual user printing, storage and reuse experience. Plates which had been exposed, developed, light finished and post-exposed were placed in an oven at 140° F. (60° C.) for two weeks. The thickness loss was taken as the difference between the thickness of the raw (unexposed) plate and the thickness of the oven-aged, fully processed plate.

To determine the back exposure time, plates were exposed through the transparent support such that different segments of each plate were exposed for different amounts of time (typically in the range of 0-150 seconds). The plates were then developed by washing with Cyrel ® Washout Solvent for 5 minutes and dried for 1 hour. The depth of the plate floor developed at each exposure time was measured. The preferred back exposure time was the time required to achieve a floor depth of 35-40 mils (0.09-0.10 cm) for 67-125 mil thick plates (0.17-0.32 cm).

A main exposure test was used to determine the exposure time to hold positive images without reverses filling in (i.e., hold a 7 mil line and a 2% highlight dot). Raw plates were first backexposed overall for the length of time determined above. The coversheet was then removed and the plate was exposed through a test negative such that different areas of the plate were exposed for different amounts of time (typically from 200 to 600 or more seconds). The plates were developed as described above. The exposure time was the minimum time required to hold a designated image for printing use (i.e., 7 mil line straight or a 2% highlight dot on a 120 lines per inch screen with no dropouts and with reverses kept open).

Similarly, a finishing test was used to determine the minimum time required to eliminate tackiness from the plate surface. The test to determine whether the plate surface was no longer tacky was a subjective one wherein one simply felt the plate.

EXAMPLE 1

This example illustrates the process of the invention where the high intensity source is used to post-expose and detackify.

A photopolymerizable element, comprising a layer of an organic solvent-developable photosensitive elastomeric composition containing a styrene-isoprene-styrene block copolymer binder, an ethylenically unsaturated monomer, and a photoinitiator system; a polyester support; and a multilayer cover element, was prepared substantially as taught by U.S. Pat. No. 4,427,759.

The element was exposed to actinic radiation through the support for 75 seconds at an intensity of approximately 7 mW/cm$^2$ using UV fluorescent lamps (Du Pont Imaging Systems Exposure Lamp, Part No. 276208-001, Wilmington, Del.) having a central wavelength of around 368 nm to form a uniform, polymerized floor. The polyester cover sheet was removed and the top surface was exposed through an image-bearing film negative for 8 minutes using the same UV fluorescent lamps to form a hardened polymerized image. Unhardened areas were removed by brushing the surface with a mixture of 3:1 perchloroethylene-butanol for approximately 5 minutes. The element was subsequently dried at 60° C. for 120 minutes. Upon cooling to room temperature, the element remained tacky. The element was then exposed to a very high intensity radiation source consisting of two 200 watt/linear inch, medium pressure, mercury vapor UV lamps (Western Quartz, Paso Robles, Calif., having a broad wavelength emission in the range of 200–700 nm at an intensity of around 78 mW/cm$^2$. The element was exposed for 19 seconds at a distance of approximately 4 inches (10 cm) from the radiation source. After the high intensity exposure, the plate surface was satisfactorily hardened and had no tackiness.

From an original plate thickness of 107 mils, the final plate had a thickness loss of only 1.1 mils and consequently demonstrated high dimensional stability throughout printing application, storage, and reuse.

COMPARATIVE EXAMPLE 1

A photopolymerizable element as described in Example 1 was exposed, developed in 3:1 perchloroethylenebutanol, and dried according to the procedure in Example 1. The element was cooled to room temperature and its surface was tacky. The element was then light finished by exposure to a radiation source consisting of 32 40 W germicidal lamps having a central wavelength of 254 nm for 9 minutes at an intensity of 7 mW/cm$^2$ at a distance of approximately 2 inches (5 cm). The light-finished element was then post-exposed for 10 minutes using the same fluorescent lamps that were used to form the plate floor and image.

The final plate had a thickness loss of 3.8 mils. This plate, in contrast to the very high intensity post exposed plate in Example 1, demonstrated relatively poor dimensional stability throughout printing application, storage and reuse, and, at times terminated the print run of an otherwise acceptable printing plate.

EXAMPLE 2

A photopolymerizable element was prepared as described in Example 1 of Gruetzmacher U.S. Pat. No. 4,427,759. The element was processed by the steps of backside and imagewise irradiation, washing out of unhardened areas, drying and finishing as in Example 1 above. A high intensity ultraviolet lamp as in Example 1, was used for post-exposure. From an original plate thickness of 107 mils, the final plate had a thickness loss of only 1.3 mils.

COMPARATIVE EXAMPLE 2

A photopolymerizable element as described in Example 2 was treated as in Comparative Example 1. The developed plate had a thickness loss of 3 mils.

EXAMPLE 3

Sheets of commercially available photosensitive elastomeric compositions were processed by the steps of backside and imagewise irradiation, washing out of unhardened areas, drying and finishing. One set of elements was finished using high intensity ultraviolet lamps as described in Example 1 above. A second set of elements was finished as described in Comparative Example 1. The results in Table 1 show that the dimensional stability of a wide variety of commercially available plates is significantly improved using the process of the invention. Similar results were obtained with other commercially available plates in terms of improved dimensional stability.

TABLE 1

| | Dimensional Stability Test* Thickness Loss-Mils | |
| --- | --- | --- |
| | Very High UV Intensity 78 mW/cm$^2$ Finishing/Hardening Only | DuPont Conventional Intensity, 7 mW/cm$^2$ All UV Exposures |
| Cyrel ® 107 HLS | 1.3 | 2.8 |
| Cyrel ® 107 PLX | 1.9 | 3.4 |
| Cyrel ® 107 HOS | 2.0 | 3.0 |
| Cyrel ® 107 PQF | 2.4 | 4.1 |
| Cyrel ® 112 DRS | 2.6 | 3.1 |
| Cyrel ® 107 LP | 2.1 | 3.6 |

*Two weeks oven baked at 140° F. (60° C.) simulates user printing, storage and reuse experience of fully processed plates.

EXAMPLE 4

This example illustrates the process of the invention where the very high intensity radiation source is used for all plate exposures.

A photopolymerizable element, comprising a layer of an organic, solvent-developable photosensitive elastomeric composition containing a styrene-butadiene-styrene block copolymer binder, an ethylenically unsaturated monomer, a photoinitiator system; a polyethylene terephthalate support; and a polyamide-coated polyester cover sheet, was prepared substantially as taught by U.S. Pat. No. 4,323,637.

From an original plate thickness of 107 mils, the final plate in this example had a thickness loss of only 1.6 mils.

COMPARATIVE EXAMPLE 3

A photopolymerizable element as described in Example 4 was exposed, developed in 3:1 perchloroethylenebutanol, dried, finished and post exposed as described in comparative example 1.

From an original plate thickness or 107 mils, the final plate had a thickness loss of 3.4 mils.

EXAMPLE 5

Sheets of commercially available photosensitive elastomeric compositions were processed by the steps of backside and imagewise irradiation, washing out of unhardened areas, drying, and finishing and hardening as described in Example 4, using high intensity UV lamps for all UV exposures. Similarly, comparative sheets were treated as described in Comparative Example 3. Thickness losses and optimum exposure times were determined as discussed above. The results are given in Tables 2 and 3 below.

TABLE 2

Dimensional Stability Test*
Thickness Loss-Mils

| | Very High UV Intensity 78 mW/cm$^2$ All UV Exposures | DuPont Conventional High UV Intensity, 7 mW/cm$^2$ All UV Exposures |
|---|---|---|
| Cyrel ® 107 HLS | 1.4 | 2.8 |
| Cyrel ® 107 HOS | 1.6 | 3.0 |
| Cyrel ® 107 PLS | 1.5 | 3.5 |
| Cyrel ® 107 PQF | 2.3 | 4.1 |

*Two weeks oven baked at 140° F. (60° C.) of fully processed plates simulates user printing, storage and reuse experience.

TABLE 3

UV Exposure Time-Seconds

| | Very High UV Intensity 78 mW/cm$^2$ | | | DuPont Conventional High UV Intensity 7 mW/cm$^2$ | | |
|---|---|---|---|---|---|---|
| | Back | Main | Post | Back | Main | Post* |
| Cyrel ® 107 HLS | 2 | 33 | 22 | 75 | 360 | 420/600 |
| Cyrel ® 107 HOS | 2 | 33 | 22 | 45 | 360 | 420/600 |
| Cyrel ® 107 PLS | 2 | 33 | 22 | 75 | 540 | 420/600 |
| Cyrel ® 107 PQF | 2 | 33 | 22 | 60 | 420 | 480/600 |

*There were 2 post exposures—one light finishing exposure at 254 nm with or followed by a second UV exposure at 368 nm.

EXAMPLE 6

Sheets of commercially available compositions were processed by the steps of backside and imagewise irradiation, washing of unhardened areas, drying, and finishing and hardening as in Example 5 with an alternate very high intensity UV lamp for all radiation exposures and with slightly longer exposure times (Fusion, UV curing "D" bulbs, 200 watt/linear inch having broad wave length emission, 200-700 nm; Fusion UV Curing Systems, 7600 Standish Place, Rockville, Md. 20855, U.S.A.). Table 4 presents comparative results which show that the process of the present invention significantly improves the dimensional stability of a variety of commercially available plates. Table 5 contains comparative UV exposure times for all UV exposures (back, image and final finishing and hardening).

TABLE 4

Dimensional Stability Test*
Thickness Loss-Mils

| | Very High UV Intensity All UV Exposures | Conventional UV High Intensity All UV Exposures |
|---|---|---|
| Cyrel ® 107 PQS | 1.5 | 3.0 |
| Cyrel ® 107 LP | 1.6 | 3.6 |
| Cyrel ® 107 HLS | 1.6 | 2.8 |
| Cyrel ® 107 PLS | 2.0 | 3.4 |
| Cyrel ® 107 PQF | 2.4 | 4.1 |
| Cyrel ® 107 DRS | 2.4 | 3.1 |
| Cyrel ® 107 HOS | 2.4 | 3.0 |

*Two weeks oven baked at 140° F. (60° C.) of fully processed plates simulates user printing, storage and reuse experience.

TABLE 5

UV Exposure Times-Seconds

| | Very High UV Intensity | | | Conventional High UV Intensity | | |
|---|---|---|---|---|---|---|
| | Back | Main | Post | Back | Main | Post* |
| Cyrel ® 107 PQS | 9 | 135 | 45 | 50 | 480 | 480/600 |
| Cyrel ® 107 LP | 9 | 135 | 45 | 120 | 780 | 480/600 |
| Cyrel ® 107 HLS | 9 | 135 | 45 | 60 | 360 | 420/600 |
| Cyrel ® 107 PLS | 9 | 135 | 45 | 60 | 480 | 480/600 |
| Cyrel ® 107 PQF | 9 | 135 | 45 | 45 | 480 | 420/600 |
| Cyrel ® 107 DRS | 9 | 135 | 45 | 45 | 420 | 420/600 |
| Cyrel ® 107 HOS | 9 | 135 | 45 | 50 | 360 | 420/600 |

*There were 2 post-exposures—one light finishing exposure at 254 nm with or followed by a second UV exposure at 368 nm.

We claim:

1. A process for substantially improving dimensional stability in a flexographic printing plate, said process comprising:
    (A) imagewise exposing a photopolymerizable layer containing
        (a) a binder,
        (b) a polymerizable monomer, and
        (c) a photoinitiator system;
    (B) removing the non-polymerized, unexposed areas with a washout developer;
    (C) drying the plate; and
    (D) post-exposing the resulting relief printing plate, wherein the dimensional stability is substantially improved by postexposing the plate with a high intensity radiation source having a UV output of at least 100 watts/linear inch and a UV intensity of at least 30 mW/cm$^2$.

2. A process according to claim 1 wherein following step C, the plate is detackified.

3. A process according to claim 1 wherein a high intensity radiation source is used to simultaneously detackify and post-expose the plate.

4. A process according to claim 1, 2, or 3 wherein a high intensity radiation source is used to imagewise expose.

* * * * *